(12) United States Patent
Tai et al.

(10) Patent No.: US 9,070,547 B2
(45) Date of Patent: Jun. 30, 2015

(54) COMPOSITE SUBSTRATE AND METHOD FOR MANUFACTURING COMPOSITE SUBSTRATE

(75) Inventors: Tomoyoshi Tai, Inazawa (JP); Yuji Hori, Owariasahi (JP)

(73) Assignee: NGK Insulators, Ltd., Nagoya (JP)

(*) Notice: Subject to any disclaimer, the term of this patent is extended or adjusted under 35 U.S.C. 154(b) by 0 days.

(21) Appl. No.: 13/295,542

(22) Filed: Nov. 14, 2011

(65) Prior Publication Data

US 2012/0119224 A1    May 17, 2012

(30) Foreign Application Priority Data

Nov. 15, 2010    (JP) .................................. 2010-254431

(51) Int. Cl.
| | |
|---|---|
| H01L 21/30 | (2006.01) |
| H01L 21/46 | (2006.01) |
| H01L 21/02 | (2006.01) |
| H01L 21/265 | (2006.01) |
| H01L 21/762 | (2006.01) |
| H01L 33/00 | (2010.01) |
| H01S 5/02 | (2006.01) |
| H01S 5/323 | (2006.01) |

(52) U.S. Cl.
CPC ....... *H01L 21/02002* (2013.01); *H01L 21/2654* (2013.01); *H01L 21/76254* (2013.01); *H01L 33/007* (2013.01); *H01S 5/0206* (2013.01); *H01S 5/32341* (2013.01); *H01L 2924/0002* (2013.01)

(58) Field of Classification Search
CPC .................. H01L 21/02002; H01L 21/02013; H01L 21/76254; H01L 21/76251; H01L 21/2007

USPC .................. 438/478, 455, 458; 257/E21.567, 257/E21.568
See application file for complete search history.

(56) References Cited

U.S. PATENT DOCUMENTS

| | | | |
|---|---|---|---|
| 6,335,263 B1 * | 1/2002 | Cheung et al. ................ | 438/455 |
| 7,208,392 B1 * | 4/2007 | Jaussaud et al. .............. | 438/455 |
| 7,863,636 B2 * | 1/2011 | Sakata et al. .................... | 257/98 |
| 8,004,006 B2 * | 8/2011 | Nakahara et al. ............... | 257/99 |
| 8,153,500 B2 * | 4/2012 | Faure et al. .................... | 438/406 |
| 8,448,842 B1 * | 5/2013 | Wu ................................ | 228/209 |

(Continued)

FOREIGN PATENT DOCUMENTS

| | | |
|---|---|---|
| CN | 101273472 A | 9/2008 |
| JP | 2007-227415 A1 | 9/2007 |

(Continued)

OTHER PUBLICATIONS

A. Tauzin et al., "*Transfers of 2-inch GaN Films onto Sapphire Substrates Using Smart Cue™ Technology*," Electronics Letters, May 26, 2005, vol. 41, No. 11 pp. 668-670.

(Continued)

*Primary Examiner* — Latanya N Crawford
(74) *Attorney, Agent, or Firm* — Burr & Brown, PLLC

(57) ABSTRACT

A metal film is formed on at least a surface of a second substrate composed of ceramic (step c), and a first substrate composed of a group nitride is bonded to the second substrate through the metal film (step d). Since the metal film generally has higher thermal conductivity than oxide films, a composite substrate having high heat dissipation can be produced as compared with a case where the first substrate is bonded to the second substrate through an oxide film. In addition, a step of out diffusion is not required because of nonuse of an oxide film, thereby simplifying the process.

4 Claims, 3 Drawing Sheets

(56) References Cited

U.S. PATENT DOCUMENTS

| | | | |
|---|---|---|---|
| 2006/0228820 A1* | 10/2006 | Kerdiles et al. | 438/22 |
| 2006/0251137 A1* | 11/2006 | Sung et al. | 372/46.01 |
| 2007/0072324 A1* | 3/2007 | Krames et al. | 438/46 |
| 2007/0141749 A1* | 6/2007 | Lin et al. | 438/108 |
| 2008/0093618 A1* | 4/2008 | Lee et al. | 257/98 |
| 2008/0251808 A1* | 10/2008 | Kususe et al. | 257/98 |
| 2009/0029499 A1* | 1/2009 | Nakahara | 438/46 |
| 2010/0035406 A1 | 2/2010 | Hachigo | |
| 2010/0067208 A1* | 3/2010 | Inoue et al. | 361/803 |
| 2010/0109126 A1* | 5/2010 | Arena | 257/615 |
| 2010/0276665 A1* | 11/2010 | Wang | 257/15 |
| 2010/0314651 A1* | 12/2010 | Lin | 257/98 |
| 2011/0057294 A1* | 3/2011 | Arena | 257/615 |
| 2011/0062488 A1* | 3/2011 | Uemura et al. | 257/103 |
| 2011/0315997 A1* | 12/2011 | Hachigo | 257/76 |
| 2012/0000415 A1* | 1/2012 | D'Evelyn et al. | 117/94 |
| 2012/0171789 A1* | 7/2012 | Suehiro et al. | 438/28 |
| 2013/0049016 A1* | 2/2013 | Schellhammer et al. | 257/80 |

FOREIGN PATENT DOCUMENTS

| | | | |
|---|---|---|---|
| JP | 2010-045098 A1 | | 2/2010 |
| JP | 2010180081 A | * | 8/2010 |
| TW | 201030814 A1 | | 8/2010 |
| WO | 2007/036865 A1 | | 4/2007 |

OTHER PUBLICATIONS

Chinese Office Action (With English Translation), Chinese Application No. 201110370293.9, dated Dec. 24, 2014 (18 pages).

* cited by examiner

COMPOSITE SUBSTRATE AND METHOD FOR MANUFACTURING COMPOSITE SUBSTRATE

BACKGROUND OF THE INVENTION

1. Field of the Invention

The present invention relates to a composite substrate and a method for manufacturing a composite substrate.

2. Description of the Related Art

In general, composite substrates each including a base substrate and a substrate bonded thereto and composed of a group 13 nitride, such as gallium nitride, are used for manufacturing semiconductor devices such as blue LED, white LED, blue-violet semiconductor lasers, and power semiconductors. For example, Patent Literature 1 describes a method for manufacturing such a composite substrate, the method including bonding together a gallium nitride substrate and a base substrate through an oxide film. Specifically, first, the gallium nitride substrate and the base substrate composed of sapphire, silicon carbide, or alumina are prepared. Next, hydrogen ions are implanted into the gallium nitride substrate to form an ion-implanted layer, and an oxide film is formed on a surface of the base substrate. Then, the back surface of the gallium nitride substrate and the surface of the oxide film are polished, and then both substrates are bonded together with the oxide film formed therebetween. Then, the gallium nitride substrate is separated at the ion-implanted layer to produce a composite substrate. In this method, the oxide film is polished, and both substrates are bonded together through the oxide film, thereby achieving sufficient adhesive force.

In addition, in the method for manufacturing a composite substrate in Patent Literature 1, the ion-implanted layer is formed, and the gallium nitride substrate is separated so that a gallium nitride substrate remaining on the composite substrate has a desired thickness. The reason for this is that the separated gallium nitride can also be used for manufacturing another composite substrate, and thus expensive gallium nitride can be efficiently used as compared with a case where a desired thickness is achieved by polishing. The separation using ion implantation is also described in Patent Literature 2 and Non-Patent Literature 1. In particular, Patent Literature 2 describes a method for recovering crystallinity of a gallium nitride substrate which is decreased due to ion passage by ion implantation. Specifically, crystallinity can be recovered by annealing at 700° C. or more in an atmosphere of nitrogen-containing gas.

Also, Patent Literature 1 describes that in the method for manufacturing a composite substrate, the gallium nitride substrate and the base substrate are bonded through the oxide film and then heated to 900° C. or more in a non-oxidizing atmosphere to thin the oxide film by out diffusion. It is further described that an adverse effect of the low thermal conductivity of the oxide film on heat dissipation of the composite substrate can be minimized.

CITATION LIST

Patent Literature

PTL 1: Japanese Unexamined Patent Application Publication No. 2007-227415

PTL 2: Japanese Unexamined Patent Application Publication No. 2010-045098

Non Patent Literature

NPL 1: Transfers of 2-inch GaN films onto sapphire substrates using Smart Cut technology, ELECTRONICS LETTERS 26th, May 2005, Vol. 41, No. 11

However, the composite substrate described in PTL 1 has a problem that even when the oxide film is thinned by out diffusion, deterioration in heat dissipation due to the oxide film cannot be completely eliminated. There is also a problem that a step of out diffusion for thinning the oxide film is required, thereby complicating the process.

The present invention has been achieved in consideration of the above-mentioned problems, and a main object of the present invention is to improve heat dissipation of a composite substrate and simplify a process for manufacturing the composite substrate, the composite substrate including a first substrate composed of a group 13 nitride and a second substrate composed of ceramic which are bonded together.

SUMMARY OF THE INVENTION

In order to achieve the object, the present invention takes a measure described below.

A method for manufacturing a composite substrate of the present invention includes: (a) a step of preparing a first substrate composed of a group 13 nitride and a second substrate composed of ceramic; (b) a step of forming an ion-implanted layer in the first substrate by implanting hydrogen ions or rare gas ions into a back surface of the first substrate; (c) a step of forming, by a physical vapor deposition method or a chemical vapor deposition method, metal film on at least a surface of the second substrate among the back surface of the first substrate and the surface of the second substrate; (d) a step of bonding together the back surface of the first substrate and the surface of the second substrate through the metal film; and (e) a step of separating the front surface side of the first substrate from the ion-implanted layer in the first substrate.

The method for manufacturing a composite substrate according to the present invention includes forming, by a physical vapor deposition method or a chemical vapor deposition method, the metal film on the surface of at least the second substrate among the back surface of the first substrate composed of a group 13 nitride and the surface of the second substrate composed of ceramic. Then, the first substrate and the second substrate are bonded together with the metal film disposed therebetween. Since the metal film generally has higher heat conductivity than oxide films, this method can produce the composite substrate having good heat dissipation as compared with the case of bonding through an oxide film. In addition, the step of out diffusion is not required because of nonuse of an oxide film. Therefore, in the composite substrate including the first substrate composed of a group 13 nitride and the second substrate composed of ceramic which are bonded together, it is possible to improve heat dissipation and simplify the manufacturing process. In addition, when the metal film is formed on only the surface of the second substrate in the step (c), it is preferred to mirror-polish the back surface of the first substrate and the surface of the metal film in step (d) before bonding. Similarly, when the metal film is formed on both the back surface of the first substrate and the surface of the second substrate in the step (c), it is preferred to mirror-polish the surface of the metal film formed on the first substrate and the surface of the metal film formed on the second substrate in step (d) before bonding.

In the method for manufacturing a composite substrate of the present invention, the metal film may be composed of at least one of molybdenum, tungsten, copper, gold, tantalum, chromium, iron, nickel, and platinum. The first substrate may be composed of gallium nitride. Further, the second substrate may be composed of aluminum nitride or silicon carbide.

A composite substrate of the present invention comprises: a first substrate composed of a group 13 nitride; a second substrate composed of ceramic; and a metal film which bonds together the first substrate and the second substrate.

The composite substrate according to the present invention can be manufactured by the above-described method for manufacturing a composite substrate of the present invention. The composite substrate includes the first substrate and the second substrate which are bonded together with the metal film disposed therebetween, thereby improving heat dissipation and simplifying the manufacturing process as compared with a composite substrate manufactured by bonding through an oxide film.

In the composite substrate of the present invention, the metal film may be composed of at least one of molybdenum, tungsten, copper, gold, tantalum, chromium, iron, nickel, and platinum. The first substrate may be composed of gallium nitride. Further, the second substrate may be composed of aluminum nitride or silicon carbide.

DETAILED DESCRIPTION OF THE INVENTION

Figure 1:
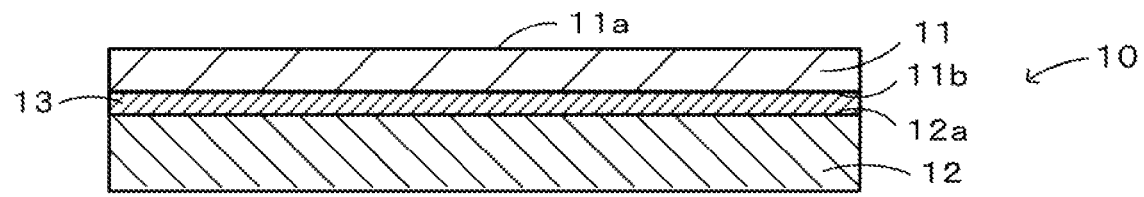
FIG. 1 is a sectional view schematically showing a composite substrate 10.

Next, an embodiment of the present invention is described on the basis of the drawings. FIG. 1 is a sectional view schematically showing a composite substrate 10 according to an embodiment. The composite substrate 10 includes a first substrate 11, a second substrate 12, and a metal film 13 which bonds together the first substrate 11 and the second substrate 12.

The first substrate 11 is a substrate composed of a group 13 nitride, for example, gallium nitride. The size of the first substrate 11 is not particularly limited, but has, for example, a diameter of 50 to 100 mm and a thickness of 0.1 to 3 μm. The surface roughness of the surface 11a of the first substrate 11 is preferably, for example, 0.1 to 3 nm in terms of arithmetic mean roughness Ra, so that a semiconductor device can be manufactured on the surface.

The second substrate 12 is a substrate composed of ceramic and bonded to the first substrate 11 through the metal film 13. The second substrate 12 functions as a base substrate for facilitating handling of the composite substrate 10 and protecting the first substrate 11. A ceramic material preferably has a Young's modulus of 150 GPa or more. In addition, a material having high thermal conductivity (for example, 100 W/m·K or more) is preferred for improving the heat dissipation. Examples of the material include, but are particularly not limited to, aluminum nitride, silicon carbide, silicon nitride, and the like. Further, the material preferably has a coefficient of thermal expansion close to that of the first substrate 11 because the occurrence of warping or cracking in the composite substrate 10 can be prevented during heat treatment. For example, when the first substrate 11 is composed of gallium nitride, the second substrate 12 is preferably composed of aluminum nitride or silicon carbide. When the first substrate is composed of gallium nitride, and the second substrate is composed of aluminum nitride or silicon carbide, the occurrence of warping or cracking in the composite substrate 10 during heat treatment can be prevented because the coefficients of thermal expansion of both substrates are close to each other. The size of the second substrate 12 is not particularly limited, but has, for example, a diameter of 50 to 100 mm and a thickness of 300 to 500 μm.

The metal film 13 is adapted for bonding the back surface 11b of the first substrate 11 to the surface 12a of the second substrate 12. The material of the metal film 13 preferably has high thermal conductivity (for example, 50 W/m·K or more) because the heat dissipation is improved. The material more preferably has a thermal conductivity of 100 W/m·K or more. In addition, it is preferred that mirror polishing can be performed (for example, polishing can be performed until arithmetic mean roughness Ra becomes 1 nm or less) in the process for manufacturing the composite substrate 10 described below. Further, the heatproof temperature is preferably 1000° C. or more so that the metal film can resist the process for manufacturing the composite substrate 10 described below and a subsequent process for manufacturing a semiconductor. Examples of the material of the metal film 13 which satisfies these conditions include, but are not particularly limited to, molybdenum, tungsten, copper, gold, tantalum, chromium, iron, nickel, and platinum. When the first substrate 11 is composed of gallium nitride, the materials except gold and chromium among these materials of the metal film 13 are particularly preferred because the coefficient of thermal expansion of the metal film 13 is close to that of the first substrate 11. The thickness of the metal film 13 is not particularly limited but is, for example, 0.01 to 2 μm. The thickness of the metal film 13 may be 0.1 to 2 μm. In addition, the metal film 13 may be made of at least one of molybdenum, tungsten, copper, gold, tantalum, chromium, iron, nickel, and platinum. For example, the metal film 13 may include a laminate of a plurality of layers of different materials each of which is composed of any one of molybdenum, tungsten, copper, gold, tantalum, chromium, iron, nickel, and platinum. For example, the metal film 13 may include an under layer of chromium and a gold layer formed thereon.

The composite substrate 10 may be used for semiconductor devices such as blue LED, white LED, a blue-violet semiconductor laser, and a power semiconductor. For example, a LED device for illumination can be formed as follows. First, an epitaxial layer of a group 13 nitride semiconductor is formed on the surface 11a of the first substrate 11 of the composite substrate 10 by a MOCVD (Metalorganic Chemical Vapor Deposition) method or a MBE (Molecular Beam Epitaxial) method, and at the same time, electrodes are formed by a vapor deposition method, forming a LED wafer including an assembly of many LED chips. Then, the LED wafer is cut into the respective LED chips by dicing. Each of the LED chips is bonded to a substrate, and wiring for light emission is formed by wire bonding, followed by sealing with a resin to form a LED device for illumination.

Next, the method for manufacturing the composite substrate 10 is described below with reference to FIG. 2. FIG. 2 is a sectional view schematically showing steps for manufacturing the composite substrate 10. The method for manufacturing the composite substrate 10 includes (a) a step of preparing a first substrate 21 composed of a group 13 nitride and a second substrate 12 composed of ceramic, (b) step of implanting hydrogen ions or rare gas ions into the back surface 21b of the first substrate 21 to form an ion-implanted layer 21c in the first substrate 21, (c) a step of forming a petal film 23 on the surface 12a of the second substrate 12, (d) a step of bonding the back surface 21b of the first substrate 21 and the surface 12a of the second substrate 12 through the metal film 23, and (e) a step of separating the surface 21a side of the first substrate 21 from the ion-implanted layer 21c in the first substrate 21.

Figure 2A:
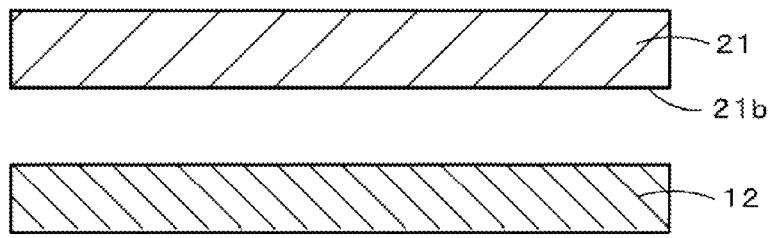
FIG. 2 is a sectional view schematically showing a process for manufacturing a composite substrate 10.

In the step (a), the first substrate 21 serving as the first substrate 11 and the second substrate 12 are prepared (FIG. 2A). The first substrate 21 having the same diameter as that of the first substrate 11 and a thickness larger than that of the first substrate 11 can be used. The thickness of the first substrate 21 is not particularly limited but may be, for example, 300 to 500 μm. Also, the thickness of the first substrate 21 may be 300 to 350 μm.

Figure 2B:
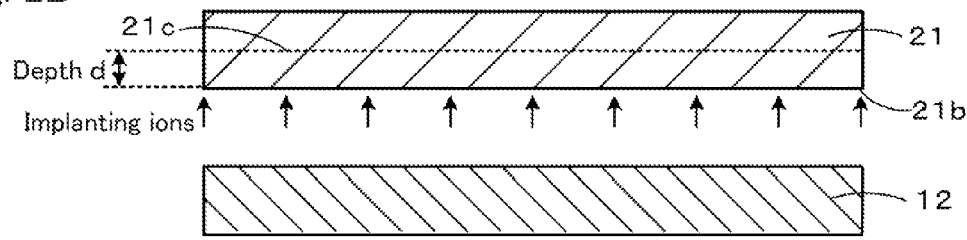

In the step (b), hydrogen ions or rare gas ions are implanted into the back surface 21b of the first substrate 21 to form the ion-implanted layer 21c in the first substrate 21 (FIG. 2B). The depth d of the ion-implanted layer 21c from the back surface 21b is a value corresponding to the thickness of the first substrate 11 shown in FIG. 1, and is, for example, 0.1 to 3 μm. The conditions for ion implantation to form the ion-implanted layer are not particularly limited but may include, for example, a temperature of the first substrate 21 of 150° C., an implantation energy of 60 keV, and a dose of $1\times10^{16}$ to $1\times10^{18}$ atoms/cm$^2$.

Figure 2C:
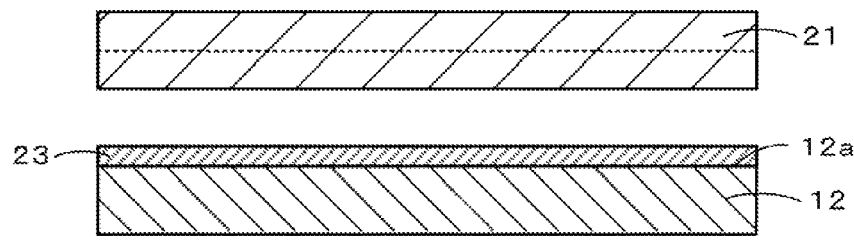

In the step (c), the metal film 23 serving as the metal film 13 is formed on the surface 12a of the second substrate 12 (FIG. 2C). The metal film 23 composed of the above-described material can be used. The thickness of the metal film 23 is not particularly limited but is, for example, 0.01 to 2 μm. The thickness of the metal film 23 may be 0.1 to 2 μm. The metal film 23 can be formed using, for example, a physical vapor deposition method such as sputtering or vacuum deposition, or a chemical vapor deposition method such as plasma CVD.

Figure 2D:
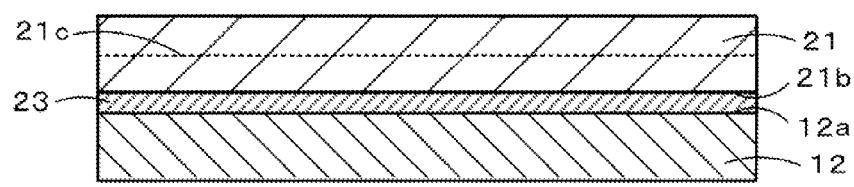

In the step (d), the back surface 21b of the first substrate 21 is bonded to the surface 12a of the second substrate 12 through the metal film 23 (FIG. 2D). This bonding may be performed by any desired method as long as direct bonding can be performed without using a resin adhesive. Possible examples of the method include a method of irradiating the bonded surfaces with argon beams at room temperature in vacuum, then bring the bonded surfaces in contact with each other, and bonding the surfaces by applying a load; and a method of irradiating the bonded surfaces with plasma, bonding the surfaces in air, and then heating the surfaces. In addition, before the bonding, the bonded surfaces, i.e., the back surface 21b of the first substrate 21 and the surface of the metal film 23, are mirror-polished. The mirror polishing is preferably performed so that arithmetic mean roughness Ra is, for example, 1 nm or less. The polishing can be performed using, for example, slurry containing colloidal silica or nano-diamond slurry. In this case, sufficient adhesive force can be achieved in the bonding in the step (d). When ceramic is used as the second substrate 12, the arithmetic mean roughness Ra of the surface 12a of the second substrate 12 cannot be sufficiently decreased even by polishing, and thus sufficient adhesive force may not be achieved by direct boning between the first substrate 21 and the second substrate 12. Even in this case, sufficient adhesive force can be achieved by bonding in the step (d) after mirror-polishing the metal film 23 formed on the surface 12a of the second substrate 12.

Figure 2E:
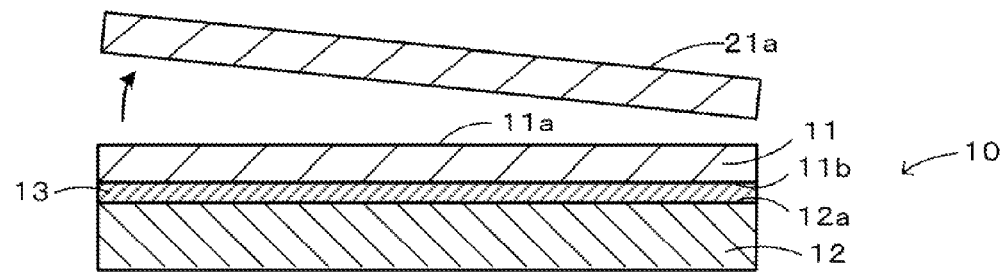

In the step (e), the surface 21a side of the first substrate 21 is separated from the ion-implanted layer 21c (refer to FIG. 2D) in the first substrate 21 (FIG. 2E). This separation can be caused by applying mechanical shock to the ion-implanted layer 21c or heating. Examples of the method for applying mechanical shock include a method of spraying a fluid jet, such as a gas or a liquid, to the side surface of the first substrate 21, and a method of driving a wedge in the ion-implanted layer 21c from the side surface of the first substrate 21. By separating the surface 21a side of the first substrate 21 from the ion-implanted layer 21c in the first substrate 21, the remaining portion of the first substrate 21 serves as the first substrate 11 shown in FIG. 1, and thus the first substrate 11 having a desired value of thickness can be formed. In this step (e), the composite substrate 10 shown in FIG. 1 is produced. In addition, a step of mirror-polishing the surface 11a of the first substrate 11 until the surface roughness is 0.1 to 3 nm in terms of arithmetic mean roughness Ra may be further performed so that a semiconductor device can be formed on the surface 11a of the first substrate 11.

According to the method for manufacturing the composite substrate 10 of the embodiment described above, the metal film 23 is formed on the surface 12a of the second substrate 12 composed of ceramic. Then, in the step (d), the first substrate 21 composed of a group 13 nitride is bonded to the second substrate 12 through the metal film 23. Since the metal film 23 generally has higher thermal conductivity than oxide films, it is possible to manufacture the composite substrate 10 having higher heat dissipation than in a case where the first substrate 21 and the second substrate 12 are bonded together through an oxide film. In addition, the step of out diffusion is not required because of nonuse of the oxide film, thereby simplifying the manufacturing process:

The present invention is not limited to the above-described embodiment. It is clear that the present invention can be implemented in a variety of embodiments without departing from the technical scope thereof.

Figure 3:
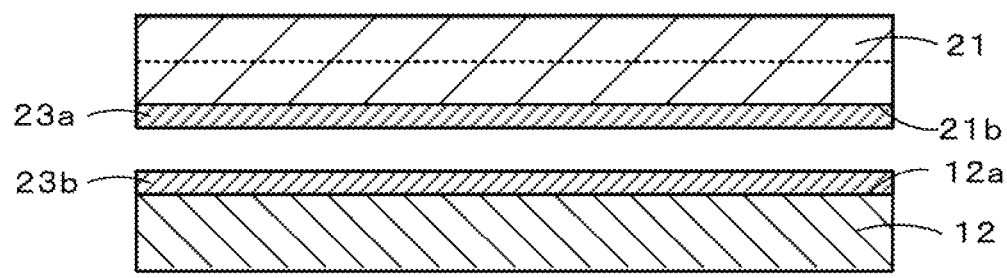
FIG. 3 is a sectional view schematically showing the state of step (c) of a modified example.

For example, although, in the embodiment, the metal film 23 is formed on the surface 12a of the second substrate 12 in the step (c), a metal film may be also formed on the back surface 21b of the first substrate 21. The state of the step (c) in this modified example is shown in FIG. 3. As shown in FIG. 3, in the step (c), a metal film 23a is formed on the back surface 21b of the first substrate 21, and a metal film 23b is formed on the surface 12a of the second substrate 12. The metal films 23a and 23b can be formed by the same method as for forming the metal film 23 in the step (c) of the embodiment. In addition, with respect to the thickness of each of the metal films 23a and 23b, the total thickness of both films may be the same as that of the metal film 23, for example, 0.01 to 5 μm. Also, the total thickness of both films may be 0.1 to 5 μm. When the metal films 23a and 23b are formed in the step (c) of the modified example, the metal films 23a and 23b are bonded together in the bonding step (d). Therefore, other than the bonding method in the above-described step (d), a bonding method using atomic diffusion between metals can also be used. The metal film 23a and the metal film 23b may be made of the same material or different materials. Further, when the metal films 23a and 23b are formed in the step (c) of the modified example, the metal films 23a and 23b are preferably bonded together in the step (d) after mirror polishing of both surfaces. As a result, even when the first substrate 21 is composed of a material with which like in the second substrate 12, arithmetic mean roughness Ra cannot be obtained for achieving sufficient adhesive force by bonding in the step (d), sufficient adhesive force can be achieved by bonding the first substrate 21 and the second substrate 12 through the mirror-polished metal films 23a and 23b.

EXAMPLES

Example 1

In Example 1, the composite substrate 10 shown in FIG. 1 was formed by the manufacturing method described with reference to FIG. 2. First, in the step (a), the first substrate 21 composed of gallium nitride and having a diameter of 2 inches and a thickness of 350 µm and the second substrate 12 composed of aluminum nitride ceramic and having a diameter of 2 inches and a thickness of 500 µm were prepared.

Next, in the step (b), hydrogen ions were implanted into the back surface 21b of the first substrate 21. Specifically, hydrogen ions were implanted under the implantation conditions including an implantation energy of 60 keV and a dose of $3 \times 10^{17}$ atoms/cm$^2$ so that depth d at which the ion-implanted layer 21c was formed was 0.5 µm.

Then, in the step (c), the metal film 23 composed of molybdenum was formed on the surface 12a of the second substrate 12. Specifically, a film was deposited using a parallel plate-type RF sputtering apparatus for 2 hours under the conditions including a degree of vacuum of $1.8 \times 10^{-4}$ Pa at the start of deposition, a gas (Ar) pressure of 0.3 Pa, and a gas flow rate of 80 sccm. As a result, the thickness of the metal film 23 was 1 µm. In addition, the arithmetic mean roughness Ra in a 10-µm square measurement range of the surface of the metal film 23 was 15 nm.

In the step (d), first, the back surface 21b of the first substrate 21 was polished. Specifically, as rough polishing, the back surface 21b of the first substrate 21 was polished for 5 hours using slurry containing diamond abrasive grains having a particle diameter of 0.5 µm and a metal platen. As a result of measurement of surface roughness of the back surface 21b with AFM (Atomic Force Microscope), the arithmetic mean roughness Ra within a 20-µm square measurement range was improved to 2.0 nm from 2.7 nm by the rough polishing. Then, in order to remove scratches with a depth of 2 to 3 ||m remaining on the back surface 21b after rough polishing, CMP polishing was performed as fine polishing. The CMP polishing was performed for 24 hours using slurry containing colloidal silica and a polyurethane pad. As a result, the scratches on the back surface 21b were completely removed, and the arithmetic mean roughness Ra within a 10-µm square measurement range was 1 nm or less.

Then, the surface of the metal film 23 was mirror-polished. Specifically, CMP polishing was performed for 1 hour using slurry containing colloidal silica and a polyurethane pad. As a result, the arithmetic mean roughness Ra within the 10-µm square measurement range of the surface of the metal film 23 was less than 1 nm.

Next, the back surface 21b of the first substrate 21 and the surface 12a of the second substrate 12 were bonded together through the metal film 23. Specifically, first, the first substrate 21 and the second substrate 12 were placed in a vacuum chamber in which the back surface 21b of the first substrate 21 and the surface of the metal film 23 formed on the second substrate 12 were irradiated with argon beams for 3 minutes. Then, both irradiated surfaces were brought into contact and bonded together by applying a load of 1 ton at room temperature.

In the step (e), the substrates bonded in the step (d) were placed in a heating furnace and heated to 700° C. Consequently, the surface 21a side of the first substrate 21 was separated from the ion-implanted layer 21c. The thickness of the first substrate 11 remaining unseparated on the second substrate 12 side was 0.5 µm. The composite substrate 10 of Example 1 shown in FIG. 1 was produced as described above.

The thus-formed composite substrate 10 of Example 1 includes the first substrate 11 and the second substrate 12 which are bonded together through the metal film 13 composed of molybdenum. On the other hand, for example, in the composite substrate described in PTL 1, the first and second substrates are bonded together through an oxide film of silicon dioxide or aluminum oxide. In this case, the thermal conductivity of molybdenum is 150 W/m·K, and the thermal conductivities of silicon dioxide and aluminum oxide are 10 W/m·K and 20 to 40 W/m·K, respectively. Therefore, it is found that a semiconductor device formed using the composite substrate 10 of Example 1 is improved in heat dissipation of the first substrate 21 as compared with a composite substrate formed by bonding through an oxide film.

Example 2

Example 2, the composite substrate 10 shown in FIG. 1 was formed by the manufacturing method including the step (c) of the modified example described with reference to FIG. 3. First, in the step (a), the first substrate 21 composed of gallium nitride and having a diameter of 2 inches and a thickness of 400 µm and the second substrate 12 composed of aluminum nitride ceramic and having a diameter of 2 inches and a thickness of 400 µm were prepared.

Next, in the step (b), hydrogen ions were implanted into the back surface 21b of the first substrate 21. Specifically, hydrogen ions were implanted under the implantation conditions including an implantation energy of 240 keV and a dose of $3 \times 10^{17}$ atoms/cm$^2$ so that depth d at which the ion-implanted layer 21c was formed was 1.5 µm.

Next, in the step (c), first, the back surface 21b of the first substrate 21 was polished. Specifically, as rough polishing, the back surface 21b of the first substrate 21 was polished for 5 hours using slurry containing diamond abrasive grains having a particle diameter of 0.5 µm and a metal platen. As a result of measurement of surface roughness of the back surface 21b with AFM, the arithmetic mean roughness Ra within a 20-µm square measurement range was improved to 2.0 nm from 2.7 nm by the rough polishing. Then, in order to remove scratches with a depth of 2 to 3 µm remaining on the back surface 21b after rough polishing, CMP polishing was performed as fine polishing. The CMP polishing was performed for 24 hours using slurry containing colloidal silica and a polyurethane pad. As a result, the scratches on the back surface 21b were completely removed, and the arithmetic mean roughness Ra within a 10-µm square measurement range was 1 nm or less. Then, the surface 12a of the second substrate 12 was polished. Specifically, polishing was performed for 5 hours using slurry containing colloidal silica and a polyurethane pad. As a result, the arithmetic mean roughness Ra within the 10-µm square measurement range was 2.3 nm.

Then, the metal films 23a and 23b composed of gold and chromium, in which gold was formed on a chromium base, were formed on the back surface 21a of the first substrate 21 and the surface 12a of the second substrate 12, respectively. Specifically, the films were deposited using a parallel plate-type RF sputtering apparatus under the conditions including a degree of vacuum of $1.5 \times 10^{-5}$ Pa at the start of deposition, a gas (Ar) pressure of 0.5 Pa, a gas (Ar) flow rate of 20 sccm, and substrate heating at 150° C. In a deposition chamber, a wafer transfer rates for chromium deposition and gold deposition were 14,000 pps and 3,600 pps, respectively, and the numbers of transfers for chromium deposition and gold deposition were 1 and 3, respectively. As a result, in each of the metal films 23a and 23b, the thickness of the gold film was 150 nm, and the thickness of the chromium film was 3 nm. The reason for using chromium as the base film for gold is to enhance the adhesive force between gold and the wafer. In addition, the arithmetic mean roughness Ra in a 10-µm square measurement range of the surface of the metal films 23a and 23b was 3 nm.

Next, in the step (d), the back surface 21b of the first substrate 21 and the surface 12a of the second substrate 12 were bonded together through the metal films 23a and 23b. Specifically, first, the first substrate 21 and the second substrate 12 were placed in a vacuum chamber in which the surface of the metal film 23a formed on the back surface 21b of the first substrate 21 and the surface of the metal film 23b formed on the surface 12a of the second substrate 12 were irradiated with argon beams for 3 minutes. Then, both irradiated surfaces were brought into contact and bonded together by applying a load of 2 tons at room temperature.

In the step (e), the substrates bonded in the step (d) were placed in a heating furnace and heated to 700° C. Consequently, the surface 21a side of the first substrate 21 was separated from the ion-implanted layer 21c. The thickness of the first substrate 11 remaining unseparated on the second substrate 12 side was 1.5 μm. The composite substrate 10 of Example 2 shown in FIG. 1 was produced as described above.

Comparative Example 1

In Comparative Example 1, a composite substrate was formed by directly boding the first substrate 21 and the second substrate 12 without forming the metal film 23. Specifically, first, the same steps (a) and (b) as in Example 1 were performed.

Then, in the step (d), the surface 12a of the second substrate 12 was polished without performing the step (c) of Example 1. However, grain drop of the crystal of the second substrate 12 occurred by polishing, thereby failing to decrease the formation of grain boundary steps. Therefore, the arithmetic mean roughness Ra in a 10-μm square measurement range of the surface 12a of the second substrate 12 was improved to 2 nm from 13.2 nm by polishing, but the arithmetic mean roughness Ra could not be further improved. Next, the back surface 21b of the first substrate 21 and the surface 12a of the second substrate 12 were irradiated with argon beams, and the first substrate 21 and the second substrate 12 were directly bonded together by contact between both irradiated surfaces and application of a load. Then, like in the step (e), the surface 21a side of the first substrate 21 was separated from the ion-implanted layer 21c. The composite substrate 10 of Comparative Example 1 was produced as described above.

Observation of Bond Condition

In each of the composite substrates of Examples 1 and 2 and Comparative Example 1, the bond condition between the first substrate 11 and the second substrate 12 was visually observed. As a result, in the composite substrate of Comparative Example 1, an unbonded portion between the first substrate 11 and the second substrate 12 was observed near the periphery. On the other hand, in the composite substrates of Examples 1 and 2, such an unbonded portion was not observed. Therefore, it was confirmed that in the composite substrate 10 of Example 1, the metal film 23 is formed on the surface 12a of the second substrate 12, mirror-polished, and then bonded to the first substrate 21, thereby improving the bond condition as compared with in Comparative Example 1. In addition, it was confirmed that in the composite substrate 10 of Example 2, the metal films 23a and 23b are formed on the back surface 21b of the first substrate 21 and the surface 12a of the second substrate 12, respectively, and then the metal films 23a and 23b are bonded together after the surfaces of both films are mirror-polished, thereby improving the bond condition as compared with in Comparative Example 1.

The present application claims priority on the basis of the Japanese Patent Application No. 2010-254431 filed on Nov. 15, 2010, the entire contents of which are incorporated herein by reference.

INDUSTRIAL APPLICABILITY

The composite substrate according to the present invention can suitably be applied to semiconductor devices such as blue LED, white LED, blue-violet semiconductor lasers, and power semiconductors.

What is claimed is:

1. A method for manufacturing a composite substrate comprising:
   (a) preparing a first substrate composed of a group 13 nitride and a second substrate composed of ceramic;
   (b) forming an ion-implanted layer in the first substrate by implanting hydrogen ions or rare gas ions into a back surface of the first substrate;
   (c) performing CMP polishing of the back surface of the first substrate and a surface of the second substrate, then forming, by a physical vapor deposition method or a chemical vapor deposition method, a metal film on both the back surface of the first substrate and the surface of the second substrate, wherein the metal film formed on the back surface of the first substrate and the metal film formed on the surface of the second substrate are composed of different materials, or at least one of the metal film formed on the back surface of the first substrate and the metal film formed on the surface of the second substrate comprises a plurality of metal layers composed of different materials;
   (d) bonding together the back surface of the first substrate and the surface of the second substrate through the metal film by irradiating the metal film on the back surface of the first substrate and the metal film on the surface of the second substrate with argon beams, contacting the irradiated surfaces, and bonding together the irradiated surfaces by applying a load at room temperature; and
   (e) separating a front surface side of the first substrate from the ion-implanted layer in the first substrate;
   wherein after the bonding in step (d), the metal film bonding the first substrate and the second substrate comprises a plurality of metal layers composed of different materials.

2. The method for manufacturing a composite substrate according to claim 1, wherein the metal film is composed of at least one of molybdenum, tungsten, copper, gold, tantalum, chromium, iron, nickel, and platinum.

3. The method for manufacturing a composite substrate according to claim 1, wherein the first substrate is composed of gallium nitride.

4. The method for manufacturing a composite substrate according to claim 3, wherein the second substrate is composed of aluminum nitride or silicon carbide.

* * * * *